United States Patent
Choi et al.

(10) Patent No.: US 11,502,272 B2
(45) Date of Patent: Nov. 15, 2022

(54) OPTICAL FILM HAVING ANTISTATIC LAYERS, OPTICAL FILM PREPARATION METHOD AND ORGANIC LIGHT-EMITTING ELECTRONIC DEVICE PREPARATION METHOD

(71) Applicant: LG CHEM, LTD., Seoul (KR)

(72) Inventors: Jeong Min Choi, Daejeon (KR); Jeehyon Min, Daejeon (KR); Hee Song, Daejeon (KR); Yoonkyung Kwon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 256 days.

(21) Appl. No.: 16/756,448

(22) PCT Filed: Oct. 23, 2018

(86) PCT No.: PCT/KR2018/012537
§ 371 (c)(1),
(2) Date: Apr. 15, 2020

(87) PCT Pub. No.: WO2019/083246
PCT Pub. Date: May 2, 2019

(65) Prior Publication Data
US 2020/0335721 A1    Oct. 22, 2020

(30) Foreign Application Priority Data
Oct. 23, 2017   (KR) ........................ 10-2017-0137761

(51) Int. Cl.
*H01L 51/52* (2006.01)
*C09D 5/00* (2006.01)
(Continued)

(52) U.S. Cl.
CPC .......... *H01L 51/5253* (2013.01); *C09D 5/002* (2013.01); *C09D 5/24* (2013.01); *C09D 183/04* (2013.01); *H01L 27/323* (2013.01); *H01L 27/3244* (2013.01); *H01L 51/56* (2013.01); *H01L 2227/323* (2013.01)

(58) Field of Classification Search
CPC ..... H01L 51/52; H01L 51/56; H01L 51/5253; H01L 51/5236; H01L 51/5246; H01L 2227/32; C09J 7/38; C09J 7/40; C09J 7/201; C09J 183/04; C08G 77/12; C08G 77/20; C09D 183/04; C09D 5/002; C09D 5/24
See application file for complete search history.

(56) References Cited

U.S. PATENT DOCUMENTS 9,748,315 B2   8/2017   Kim
10,135,024 B2   11/2018   Lee et al.
(Continued)

FOREIGN PATENT DOCUMENTS

CN     104073196 A    10/2014
CN     104205041 A    12/2014
(Continued)

*Primary Examiner* — Kyoung Lee
*Assistant Examiner* — Christina A Sylvia
(74) *Attorney, Agent, or Firm* — Dentons US LLP (57) ABSTRACT

The present application relates to an optical film, a method for preparing an optical film, and a method for manufacturing an organic light emitting electronic device.

9 Claims, 2 Drawing Sheets

(51) Int. Cl.
  *C09D 5/24* (2006.01)
  *C09D 183/04* (2006.01)
  *H01L 27/32* (2006.01)
  *H01L 51/56* (2006.01)

(56) References Cited

U.S. PATENT DOCUMENTS

| | | | |
|---|---|---|---|
| 2009/0017249 A1* | 1/2009 | Suh | C09J 7/29 |
| | | | 428/343 |
| 2011/0014443 A1* | 1/2011 | Yokoi | H01L 21/6836 |
| | | | 428/354 |
| 2014/0017967 A1 | 1/2014 | Kim et al. | |
| 2014/0295183 A1* | 10/2014 | Yamagata | C09J 7/22 |
| | | | 525/200 |
| 2014/0318690 A1 | 10/2014 | Moon | |
| 2016/0017193 A1* | 1/2016 | Tanaka | C09J 167/02 |
| | | | 524/604 |
| 2016/0185083 A1* | 6/2016 | Yasui | B32B 3/08 |
| | | | 428/1.55 |
| 2017/0260423 A1 | 9/2017 | Son et al. | |
| 2020/0307155 A1* | 10/2020 | Yasui | B32B 17/10 |

FOREIGN PATENT DOCUMENTS

| | | |
|---|---|---|
| CN | 106661383 A | 5/2017 |
| CN | 108690528 A | 10/2018 |
| JP | 2010-525960 A | 7/2010 |
| JP | 2014021498 A | 2/2014 |
| JP | 2015518177 A | 6/2015 |
| JP | 2017-039859 A | 2/2017 |
| JP | 2017-160444 A | 9/2017 |
| JP | 2017-179242 A | 10/2017 |
| JP | 2017530202 A | 10/2017 |
| JP | 2018172611 A | 11/2018 |
| KR | 2000-0028755 A | 5/2000 |
| KR | 10-2006-0067514 A | 6/2006 |
| KR | 10-0718848 A | 5/2007 |
| KR | 10-0807910 A | 2/2008 |
| KR | 10-2010-0137456 A | 12/2010 |
| KR | 10-2015-0062088 A | 6/2015 |
| KR | 10-2015-0101988 A | 9/2015 |
| KR | 10-2016-0016267 A | 2/2016 |
| KR | 10-2017-0022904 A | 3/2017 |
| KR | 10-2017-0064600 A | 6/2017 |
| KR | 10-1758420 B1 | 7/2017 |
| KR | 10-2017-0120968 A | 11/2017 |
| KR | 10-2017-0135512 A | 12/2017 |
| TW | 201836849 A | 10/2018 |
| WO | 2008-0140567 A2 | 11/2008 |
| WO | 2015-080346 A1 | 6/2015 |

* cited by examiner

OPTICAL FILM HAVING ANTISTATIC LAYERS, OPTICAL FILM PREPARATION METHOD AND ORGANIC LIGHT-EMITTING ELECTRONIC DEVICE PREPARATION METHOD

The present application is a National Phase entry pursuant to 35 U.S.C. § 371 of International Application No. PCT/KR2018/012537 filed on Oct. 23, 2018, and claims priority to and the benefit of Korean Patent Application No. 10-2017-0137761, filed with the Korean Intellectual Property Office on Oct. 23, 2017, the entire contents of which are incorporated herein by reference.

FIELD

The present disclosure relates to an optical film, a method for preparing the optical film, and a method for manufacturing an organic light emitting electronic device using the optical film.

BACKGROUND

An organic light emitting diode (OLED) is a self-emissive-type display device, and, unlike a liquid crystal display (LCD), may be manufactured to be light and thin since a separate light source is not required. In addition, an organic light emitting diode is advantageous in terms of power consumption due to low voltage driving, and also has excellent response rate, viewing angle and contrast ratio, and has been studied as a next generation display.

The organic light emitting diode has problems in that it is very vulnerable to impurities, oxygen and moisture, and thereby has its properties readily deteriorated by external exposure, or moisture or oxygen penetration, and its lifetime is shortened. In order to resolve such problems, an encapsulation layer for preventing oxygen, moisture or the like from being introduced into an organic light emitting electronic device is required.

The encapsulation layer includes a protective film for protecting the encapsulation layer during a manufacturing process or after it is manufactured. Static electricity caused from high surface electrical resistance due to the material properties, common protective films have residues remaining in the encapsulation layer when peeling the protective film from the encapsulation layer. Foreign substances such as dirt or dust may adhere thereto causing damages to an organic light emitting device, and causing light emission defects in the organic light emitting device. In order to resolve such problems, a process of a worker removing static electricity one by one using a static electricity remover is required, which causes a problem of increasing production time and costs and thereby reducing productivity. Methods for resolving such problems have been required.

SUMMARY

An optical film of the present disclosure according to one embodiment is a film for protecting a surface of an organic light emitting device when manufacturing an organic light emitting electronic device.

The optical film of the present disclosure has an excellent antistatic function when peeling an encapsulation layer from the optical film, or peeling the optical film from an encapsulation layer, and may prevent contamination or performance decline in the device.

One embodiment of the present disclosure provides an optical film comprising a base layer comprising a base film, a first antistatic layer and a second antistatic layer each provided on opposing surfaces of the base film; a protective layer comprising a protective film, a third antistatic layer and a fourth antistatic layer each provided on opposing surfaces of the protective film; and a silicone-based adhesive layer provided between the base layer and the protective layer so that the second antistatic layer and the third antistatic layer face each other, wherein the silicone-based adhesive layer is in direct contact with the third antistatic layer.

Another embodiment of the present disclosure provides an optical film comprising a base layer comprising a base film, a first antistatic layer and a second antistatic layer each provided on both surfaces of the base film; and a silicone-based adhesive layer provided on a surface opposite to the surface facing the base film of the second antistatic layer.

One embodiment of the present disclosure provides a method for preparing an optical film comprising forming a base layer comprising a base film, a first antistatic layer and a second antistatic layer provided on both surfaces of the base film; forming a protective layer comprising a protective film, a third antistatic layer and a fourth antistatic layer each provided on opposing surfaces of the protective film; and bonding the base layer and the protective layer by a silicone-based adhesive layer, wherein the second antistatic layer and the third antistatic layer face each other, and the silicone-based adhesive layer is in direct contact with the third antistatic layer.

Another embodiment of the present disclosure provides a method for manufacturing an organic light emitting electronic device comprising removing the protective layer from the above-described optical film; and attaching the silicone-based adhesive layer of the optical film on an encapsulation layer of an organic light emitting device.

The present application provides an optical film having an excellent antistatic function, and thereby preventing foreign substances generated from static electricity when peeled from an adherend during an organic light emitting electronic device manufacturing process.

DETAILED DESCRIPTION

Hereinafter, the present specification will be described in more detail.

In the present specification, a description of a certain part "including" certain constituents means capable of further including other constituents, and does not exclude other constituents unless particularly stated on the contrary.

Embodiments of the present disclosure will be described in detail with reference to accompanying drawings so that those skilled in the art may readily implement the present disclosure. However, the present disclosure may be embodied in various different forms and is not limited to the embodiments described herein.

One embodiment of the present disclosure provides an optical film comprising a base layer; a protective layer; and a silicone-based adhesive layer.

The base layer comprises a base film, a first antistatic layer and a second antistatic layer each provided on both or opposing surfaces of the base film; the protective layer comprises a protective film, a third antistatic layer and a fourth antistatic layer each provided on both or opposing surfaces of the protective film; and the silicone-based adhesive layer is provided between the base layer and the protective layer so that the second antistatic layer and the third antistatic layer face each other.

The silicone-based adhesive layer is in direct contact with the third antistatic layer.

When providing a release layer between the silicone-based adhesive layer and the third antistatic layer, there may be a problem in that peel strength of the release layer increases over time or by being exposed to a high temperature and high humidity environment, and therefore, the silicone-based adhesive layer is preferably in direct contact with the third antistatic layer directly.

By providing the silicone-based adhesive layer on one surface of the second antistatic layer, an antistatic property of the second antistatic layer is obtained in the silicone-based adhesive layer, which may decrease cumulative electrostatic capacity of the silicone-based adhesive layer. In one embodiment, the silicone-based adhesive layer is in direct contact with the second antistatic layer.

When the silicone-based adhesive layer is prevented from accumulating static, foreign substances that may be attached to the silicone-based adhesive layer or an adherend by static electricity may be prevented when removing the protective layer from the optical film to attach the silicone-based adhesive layer to the adherend surface, or peeling the optical film from the adherend surface. As a result, deterioration in the properties of the adherend surface may be prevented by preventing contamination on the adherend surface during a process.

In one embodiment of the present disclosure, a peeling static voltage of the silicone-based adhesive layer measured at an applying voltage of 10 kV may be greater than or equal to 0 kV and less than or equal to 2 kV; or greater than or equal to 0 kV and less than or equal to 1.6 kV. By the silicone-based adhesive layer having a peeling static voltage within the above-described range, foreign substances that may be attached to the silicone-based adhesive layer or the adherend by static electricity during a process may be prevented.

In one embodiment of the present disclosure, the peeling static voltage of the silicone-based adhesive layer is a peeling static voltage obtained when cutting the optical film to have a width of 250 mm and a length of 250 mm, leaving the cut optical film unattended for 24 hours under a temperature of 23° C. and relative humidity of 50%, applying a voltage of 10 kV using a static honestmeter (static honestmeter H-0110, manufactured by Shishido Electrostatic, Ltd.), and the peeling the protective layer from the optical film at a peeling rate of 1.8 m/min and a peeling angle of 180°.

In one embodiment of the present disclosure, the peeling static voltage of the silicone-based adhesive layer measured at an applying voltage of 10 kV is a value measured under a temperature of 23° C. and relative humidity of 50%.

Figure 1:
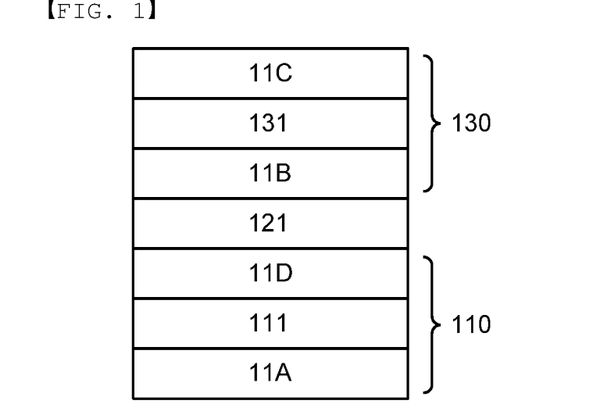
FIG. 1 is a schematic illustration of an optical film according to one embodiment.

FIG. 1 illustrates an optical film according to one embodiment of the present disclosure. FIG. 1 illustrates an optical film comprising a base layer (110) comprising a base film (111), and a first antistatic layer (11A) and a second antistatic layer (11D) each provided on both surfaces on the base film; a protective layer (130) comprising a protective film (131), and a third antistatic layer (11B) and a fourth antistatic layer (11C) each provided on both surfaces of the protective film; and a silicone-based adhesive layer (121) provided between the base layer and the protective layer so that the second antistatic layer and the third antistatic layer face each other, wherein the silicone-based adhesive layer (121) is in direct contact with the third antistatic layer.

Figure 2:
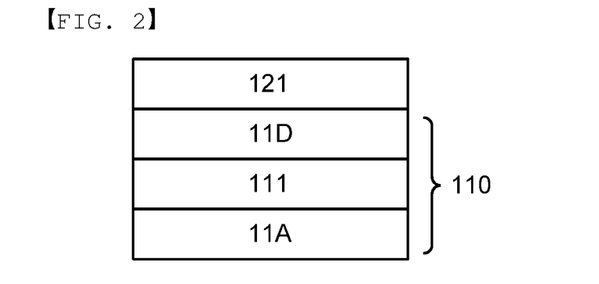
FIG. 2 is a schematic illustration of an optical film according to another embodiment.

In one embodiment, the optical film may be used by attaching the silicone-based adhesive layer on a surface of a device to protect after removing the protective layer from the optical film. FIG. 2 illustrates a state in which the protective layer is removed from the optical film of FIG. 1.

In one embodiment of the present disclosure, the base layer comprises a base film; a first antistatic layer and a second antistatic layer each provided on both or opposing surfaces of the base film, and the protective layer comprises a protective film; a third antistatic layer and a fourth antistatic layer each provided on both or opposing surfaces of the protective film. However, within a range not affecting intended effects of the present disclosure, the base layer and the protective layer may further include layers such as a primer layer or an oligomer preventing layer.

Types of the base film and the protective film are not particularly limited. Examples of the base film and the protective film may include a polyethylene terephthalate film; a polytetrafluoroethylene film; a polyethylene film; a polypropylene film; a polybutene film; a polybutadiene film; a vinyl chloride copolymer film; a polyurethane film; an ethylene-vinyl acetate film; an ethylene-propylene copolymer film; an ethylene-ethyl acrylate copolymer film; an ethylene-methyl acrylate copolymer film; a polyimide film or the like, but are not limited thereto. In one embodiment of the present disclosure, the base film and the protective film may each be a polyethylene terephthalate (PET) film.

The base film thickness may be properly selected considering purposes of the present application. For example, the base film thickness may be greater than or equal to 25 μm and less than or equal to 150 μm; greater than or equal to 50 μm and less than or equal to 125 μm; or greater than or equal to 75 μm and less than or equal to 100 μm. When bonding the optical film comprising the silicone-based adhesive layer and the base layer on an encapsulation layer of an organic light emitting device, the base film may be readily deformed when the base film thickness is less than the above-mentioned range, and bonding defects may occur when the thickness is greater than the above-mentioned thickness range.

The protective film may be properly selected considering purposes of the present application. Examples thereof may include one or more types selected from the group consisting of polyethylene terephthalate; polytetrafluoroethylene; polyethylene; polypropylene; polybutene; polybutadiene; a vinyl chloride copolymer; polyurethane; ethylene-vinyl acetate; an ethylene-propylene copolymer; an ethylene-ethyl acrylate copolymer; an ethylene-methyl acrylate copolymer; polyimide; nylon; a styrene-based resin or elastomer; a polyolefin-based resin or elastomer; other elastomers; a polyoxyalkylene-based resin or elastomer; a polyester-based resin or elastomer; a polyvinyl chloride-based resin or elastomer; a polycarbonate-based resin or elastomer; a polyphenylene sulfide-based resin or elastomer; mixtures of hydrocarbon; a polyamide-based resin or elastomer; an acrylate-based resin or elastomer; an epoxy-based resin or elastomer; a silicone-based resin or elastomer; and a liquid crystal polymer, but are not limited thereto. The protective film thickness may be properly selected considering purposes of the present application. For example, the thickness may be greater than or equal to 25 μm and less than or equal to 150 μm; greater than or equal to 25 μm and less than or equal to 125 μm; or greater than or equal to 25 μm and less than or equal to 100 μm.

The base film and the protective film may be surface treated. Examples of the surface treatment may include a corona discharge treatment, an ultraviolet irradiation treatment, a plasma treatment, a sputter etching treatment or the like, but are not limited thereto. When the base film and the protective film are surface treated, an antistatic layer may be provided on the surface of the surface-treated film.

The term 'antistatic layer' in the present specification means a layer intending to suppress static electricity generation. The term 'first to fourth antistatic layers' in the present specification means a first antistatic layer, a second antistatic layer, a third antistatic layer and a fourth antistatic layer.

The first to fourth antistatic layers may be formed using known methods to accomplish target effects. For example, the first to fourth antistatic layers may each be formed on both or opposing surfaces of the base film and both or opposing surfaces of the protective film using an inline coating method. The inline coating method is a method of monoaxially orienting an extruded film, coating a coating layer thereon, and then completing the film through biaxial orientation. In the inline coating method, coating is performed during a film preparation process, and therefore, adhesion between the coating layer and the film increases, and the coating layer is continuously provided with the film preparation shortening the process, and the film may be prepared to be as thin as possible.

In the present disclosure, the first to fourth antistatic layers may be formed to a proper antistatic composition considering purposes of the present application. For example, the first to fourth antistatic layers may comprise a thermocurable binder resin in a range not affecting effects of the present disclosure. In the present specification, the term 'thermocurable binder resin' means a binder resin that may be cured through a proper heat-applying or aging process.

As the thermocurable binder resin, one type selected from the group consisting of an acryl-based resin, an urethane-based resin, an urethane-acryl-based copolymer, an ester-based resin, an ether-based resin, an amide-based resin, an epoxy-based resin and a melamine resin, or a mixture thereof may be used, however, the thermocurable binder resin is not limited thereto.

In one example, one or more layers of the first to fourth antistatic layers may comprise a conductive material. In one embodiment, the conductive material includes a conductive polymer or a carbon nanotube.

For example, the conductive polymer may include one, two or more types selected from the group consisting of polyaniline, polypyrrole, polythiophene series, derivatives and copolymers thereof, but is not limited thereto.

Carbon nanotubes may have a tubular shape formed by rounding a graphite plate formed by connecting a hexagonal ring formed with 6 carbons. Carbon nanotubes have excellent rigidity and electrical conductivity, and when used as an antistatic layer of an optical film, hardness may increase, and an antistatic function may be enhanced.

In one embodiment of the present disclosure, the first and the second antistatic layers may each be directly provided on both or opposing surfaces of the base film. In another embodiment, the third and the fourth antistatic layers may each be directly provided on both or opposing surfaces of the protective film. When the base film or the protective film is surface treated, the antistatic layer is directly provided on the surface-treated film.

In the present specification, any layer (or surface) being directly provided on any layer (or surface) means the layer (or surface) being provided adjoining the layer (or surface).

The thicknesses of the first to fourth antistatic layers may be properly selected considering purposes of the present application, and the thickness of each of the antistatic layers may be the same as or different from each other. For example, the thicknesses of the first to fourth antistatic layers may be each independently greater than or equal to 10 nm and less than 400 nm; preferably greater than or equal to 20 nm and less than or equal to 300 nm; or greater than or equal to 20 nm and less than or equal to 100 nm. By the first to fourth antistatic layers having thicknesses in the above-described range, excellent coatability may be obtained on both surfaces of the base film or both surfaces of the protective film.

In one embodiment, surface resistance of the first to fourth antistatic layers may be properly selected considering purposes of the present application. For example, surface resistance of the first to fourth antistatic layers may be each independently $10^5$ Ω/sq or greater; $10^6$ Ω/sq or greater; $10^7$ Ω/sq or greater; $10^8$ Ω/sq or greater; or $10^9$ Ω/sq or greater. For example, surface resistance of the first to fourth antistatic layers may be each independently $5 \times 10^{12}$ Ω/sq or less; or $10^{11}$ Ω/sq or less. When the first to fourth antistatic layers have surface resistance in the above-described range, the optical film may have an excellent antistatic function.

In one embodiment, the silicone-based adhesive layer includes a cured material of a silicone-based adhesive composition.

In the present specification, 'curing' means, for example, a process of two or more types of components included in a composition chemically reacting with each other by a curing condition.

In the present specification, the 'cured material' means a final material in which, among components included in a composition, components capable of participating in a curing reaction chemically bond through the curing reaction. Formation of the cured material is not particularly limited.

The silicone-based adhesive layer composition is a curable composition, and may be a thermocurable silicone-based composition.

In the present specification, the 'thermocurable' composition means a composition in which curing is induced by applying heat.

In one embodiment, the thermocurable silicone-based composition may be a composition cured by a hydrosilylation reaction; a composition cured by a condensation reaction of silanol; an alcohol release-type, oxime release-type or acetic acid release-type silicone-based composition, or the like, but is not limited thereto.

In one embodiment, the silicone-based adhesive layer composition may include an organopolysiloxane including an alkenyl group; a organopolysiloxane including a hydrosilyl group; and a platinum-based catalyst.

In one embodiment, other organopolysiloxanes including a group that may react with an alkenyl group may also be used instead of the organopolysiloxane including a hydrosilyl group. Examples of the group that may react with an alkenyl group may include a group including a Si—OR (R is an alkyl group) bond or Si—OH bond; an amine group; a carboxylic acid group; a thiol group; an epoxy group or the like, but are not limited thereto.

The organopolysiloxane including an alkenyl group may have a structure of linear; branched; cyclic; reticular; or a combined form thereof, however, the structure is not limited thereto.

In the organopolysiloxane including an alkenyl group, the alkenyl group may be a vinyl group, an allyl group, a butenyl group, a pentenyl group, a hexenyl group, a heptenyl group or the like, but is not limited thereto. In one embodiment, the alkenyl group may bond to an end and/or a side chain of the main chain of the organopolysiloxane, however, the structure is not limited thereto.

The organopolysiloxane including an alkenyl group may further include a substituent such as an alkyl group; a halogen group; an aromatic hydrocarbon group; an alicyclic hydrocarbon group and the like.

In one embodiment, the organopolysiloxane including an alkenyl group may specifically be dimethylpolysiloxane having a dimethylvinylsiloxy group blocked at both ends of the molecular chain, a dimethylsiloxane-methylvinylsiloxane copolymer having a dimethylvinylsiloxy group blocked at both ends of the molecular chain, a dimethylsiloxane-methylphenylsiloxane copolymer having a dimethylvinylsiloxy group blocked at both ends of the molecular chain, methylvinylpolysiloxane having a trimethylsiloxy group blocked at both ends of the molecular chain, a dimethylsiloxane-methylvinylsiloxane copolymer having a trimethylsiloxy group blocked at both ends of the molecular chain, a dimethylsiloxane-methyl(5-hexenyl)siloxane copolymer having a trimethylsiloxy group blocked at both ends of the molecular chain, a dimethylsiloxane-methylvinylsiloxane-methylphenylsiloxane copolymer having a dimethylvinylsiloxy group blocked at both ends of the molecular chain, methylvinylpolysiloxane having a dimethylhydroxysiloxy group blocked at both ends of the molecular chain, a dimethylsiloxane-methylvinylsiloxane copolymer having a dimethylhydroxysiloxy group blocked at both ends of the molecular chain, or the like, but is not limited thereto.

The organopolysiloxane including a hydrosilyl group may cause a curing reaction with the organopolysiloxane including an alkenyl group. The hydrosilyl group may bond to an end and/or a side chain of the main chain of the organopolysiloxane, however, the structure is not limited thereto.

The organopolysiloxane including a hydrosilyl group may have a structure of linear; branched; cyclic; reticular; or a combined form thereof, however, the structure is not limited thereto.

The organopolysiloxane including an alkenyl group may further include a substituent such as an alkyl group; a halogen group; an aromatic hydrocarbon group; an alicyclic hydrocarbon group or the like.

In one embodiment, the content of the organopolysiloxane including a hydrosilyl group may be properly selected as long as curing is accomplished so as to obtain target adhesive layer properties of the present disclosure.

In one embodiment, when the number of the alkenyl groups included in the organopolysiloxane including an alkenyl group is employed as G1, and the number of the hydrosilyl groups included in the organopolysiloxane including a hydrosilyl group is employed as G2, G1:G2 may be from 1:0.1 to 1:10.

In one embodiment, examples of the platinum-based catalyst may include platinum-based compounds such as chloroplatinic acid, an alcohol solution of chloroplatinic acid, a complex of chloroplatinic acid and olefin, or a complex of chloroplatinic acid and alkenylsiloxane; platinum black; platinum supported silica; platinum supported activated carbon and the like, but are not limited thereto.

In one embodiment, the content of the platinum-based catalyst may be from 0.1 ppm to 10,000 ppm; 1 ppm to 8,000 ppm; or 1 ppm to 5,000 ppm based on a total solid content of the silicone-based composition, but is not limited thereto.

In one embodiment, the silicone-based composition may further include a curing retarder. In one embodiment, the curing retarder may include one, two or more types selected from the group consisting of 1-ethynyl-1-cyclohexanol, 3-methyl-1-penten-3-ol, 2-methyl-3-butyn-2-ol, 1-phenyl-3-butyn-2-ol, 2-phenyl-3-butyn-2-ol, 3,5-dimethyl-1-hexyn-3-ol, 1,5-hexadiyn, 1,6-heptadiyn, 3,5-dimethyl-1-hexyne, 2-ethyl-3-butyne, 2-phenyl-3-butyne, 1,3-divinyltetramethyldisiloxane, 1,3,5,7-tetravinyl-1,3,5,7-tetramethylcyclotetrasiloxane and 1,3-divinyl-1,3-diphenyldimethyldisiloxane, but is not limited thereto.

The content of the curing retarder may be properly selected. In one embodiment, the content of the curing retarder may be from 1 ppm to 30,000 ppm based on a solid content of the silicone-based composition, but is not limited thereto.

The silicone-based adhesive composition may further include a curing agent, a solvent, a hydrolysis inhibitor, an antioxidant, a curing accelerator, an anti-retardant and the like.

In the present disclosure, a metal ion content in the silicone-based adhesive layer is 50 ppm or less, preferably 40 ppm or less, more preferably 30 ppm or less, and particularly preferably 20 ppm or less. The metal ion means an alkali metal (group 1) such as a lithium ion, a sodium ion or a potassium ion. The metal ion content in the adhesive layer means a content of metal ions included in the adhesive layer with respect to a total weight of the adhesive layer.

In the present disclosure, a metal ion content in the silicone-based adhesive layer being 50 ppm or less means that an antistatic agent is not included in the silicone-based adhesive layer. The optical film of the present disclosure has the silicone-based adhesive layer being provided on one surface of the second antistatic layer, and an antistatic property may be obtained in the silicone-based adhesive layer even when the adhesive layer does not include an antistatic agent.

A method of forming the adhesive layer is not particularly limited, and for example, a method of forming the adhesive layer by directly coating the adhesive composition on a base layer and curing the result, a method of forming the adhesive layer by coating the adhesive composition on a surface of a peelable base first and then curing the result, and then transferring the adhesive layer on a base layer, or the like, may be used.

In one embodiment, the coating process and the curing process of the silicone-based adhesive layer may be used without limit as long as they are known methods used in the art.

The silicone-based adhesive layer may be formed by thermocuring the silicone-based adhesive composition, however, the method of thermocuring the adhesive composition is not particularly limited, and a curing temperature and a curing time may be properly selected.

In one embodiment of the present disclosure, the silicone-based adhesive layer thickness may be properly selected considering purposes of the present application. For example, the silicone-based adhesive layer thickness may be greater than or equal to 10 µm and less than or equal to 200 µm, preferably greater than or equal to 10 µm and less than or equal to 150 µm, and more preferably greater than or equal to 10 µm and less than or equal to 100 µm. By employing the thickness of the adhesive layer in the above-mentioned range, adhesion and wetting of the adhesive layer for an adherend surface may be enhanced.

In addition, the silicone-based adhesive layer has low adhesive strength with an adherend surface, and may be peeled from the adherend surface with low peel strength.

In the present specification, 'glass' may mean alkali-free glass (NEG Co., Ltd., OA-21), unless particularly limited.

In one embodiment of the present disclosure, peel strength of the silicone-based adhesive layer for glass measured at a peel angle of 180° and a peel rate of 0.3 m/min may vary by varying an adhesive layer material.

In one embodiment of the present disclosure, peel strength of the silicone-based adhesive layer for glass measured at a peel angle of 180° and a peel rate of 0.3 m/min is greater than or equal to 0.5 gf/in and less than or equal to 7 gf/in; or greater than or equal to 0.5 gf/in and less than or equal to 6.5 gf/in.

In one embodiment of the present disclosure, the peel strength of the silicone-based adhesive layer for glass may be peel strength measured when cutting the optical film to have a width of 50 mm and a length of 150 mm, peeling the protective layer from the optical film, attaching the adhesive layer of the optical film to glass using a 2 kg roller, and storing the result for 24 hours at room temperature, and then peeling the optical film from the glass at a peel rate of 0.3 m/min and a peel angle of 180° using a texture analyzer (manufactured by Stable Micro Systems of England).

In one embodiment of the present disclosure, the peel strength of the silicone-based adhesive layer for glass measured at a peel angle of 180° and a peel rate of 0.3 m/min is peel strength measured under a temperature of 23° C. and relative humidity of 50%.

In one embodiment of the present disclosure, wetting means a time taken for the adhesive to be wetted for the whole adherend surface, and as a method of measuring the wetting, methods generally used in the art may be used. For example, a method of evaluating wetting of the experimental example to describe later may be used for the measurement.

In one embodiment of the present disclosure, the wetting time of the silicone-based adhesive layer for glass is 4 seconds or shorter; longer than 0 seconds and shorter than or equal to 3 seconds; or longer than 0 seconds and shorter than or equal to 2 seconds. By the silicone-based adhesive layer having a wetting time in the above-described range, the silicone-based adhesive layer may be attached on the adherend surface without generating bubbles and the like.

In one embodiment of the present disclosure, the wetting time of the silicone-based adhesive layer for glass is measured under a temperature of 23° C. and relative humidity of 50%.

One embodiment of the present application provides an optical film comprising a base layer comprising a base film, and a first antistatic layer and a second antistatic layer each provided on both surfaces of the base film; and a silicone-based adhesive layer provided on a surface opposite to the surface facing the base film of the second antistatic layer.

Another embodiment of the present application provides a method for preparing an optical film. The preparation method may relate to, for example, a method for preparing the optical film described above. Accordingly, descriptions on the optical film provided above may be applied to an optical film formed using the method for preparing an optical film to describe below in the same manner.

In one embodiment, the method for preparing an optical film comprises forming a base layer comprising a base film, a first antistatic layer and a second antistatic layer each provided on both or opposing surfaces of the base film; forming a protective layer comprising a protective film, a third antistatic layer and a fourth antistatic layer each provided on both or opposing surfaces of the protective film; and bonding the base layer and the protective layer by a silicone-based adhesive layer, wherein the second antistatic layer and the third antistatic layer face each other, and the silicone-based adhesive layer is in direct contact with the second antistatic layer and the third antistatic layer.

In one embodiment, the method for preparing an optical film may further comprises removing the protective layer.

Another embodiment of the present application provides a method for manufacturing an organic light emitting electronic device comprising removing the protective layer from the above-described optical film; and attaching the silicone-based adhesive layer of the optical film on an encapsulation layer of an organic light emitting device.

Figure 3:
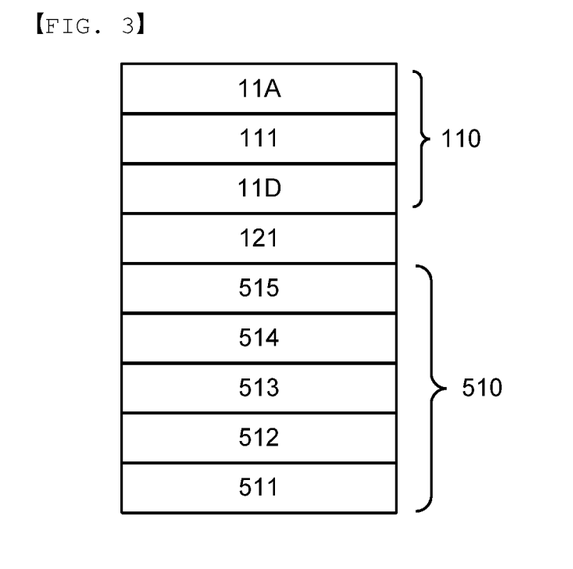
FIG. 3 is a schematic illustration of a state in which an adhesive layer is attached on an encapsulation layer during an organic light emitting electronic device manufacturing process.

FIG. 3 is a diagram illustrating a state in which the optical film comprising the base layer and the silicone-based adhesive layer is attached on the encapsulation layer during an organic light emitting electronic device manufacturing process. The organic light emitting electronic device of FIG. 3 comprises an organic light emitting device (510) consecutively comprising a back plate (511), a plastic substrate (512), a thin film transistor (513), an organic light emitting diode (514) and an encapsulation layer (515); a base layer (110) and a silicone-based adhesive layer (121).

FIG. 3 illustrates an embodiment of the optical film of the present disclosure using an organic light emitting device, and the optical film of the present disclosure may be used as a protective film in other various electronic devices.

In one embodiment of the present disclosure, the organic light emitting device may consecutively comprise a back plate, a plastic substrate, a thin film transistor, an organic light emitting diode and an encapsulation layer.

The encapsulation layer may exhibit excellent moisture barrier properties and optical properties in the organic light emitting electronic device. In addition, the encapsulation layer may be formed to a stable encapsulation layer regardless of an organic light emitting electronic device type such as top emission or bottom emission.

In one embodiment, the encapsulation layer may include a single layer or multilayer inorganic material layer. When the inorganic material layer is a multilayer, a first inorganic material layer, an organic material layer and a second inorganic material layer may be consecutively included. The single layer or multilayer inorganic material layer may be included in an outermost layer of the encapsulation layer. As a method of forming the encapsulation layer, common methods of forming an encapsulation layer known in the art may be used. In one example, an adhesive layer may be directly attached on a surface on which the organic material layer is not formed of the second inorganic material layer.

Examples of the single layer or multilayer inorganic material layer may include aluminum oxide-based, silicon nitride-based, silicon oxynitride-based and the like. The organic material layer is introduced between the first and the second inorganic material layers, and may perform a function of relieving stress of the inorganic material layer while planarizing the irregular surface caused by inorganic particles and the like. Examples of the organic material layer may include an acrylate resin, an epoxy resin or the like.

The method for manufacturing an organic light emitting electronic device of the present application may further comprise peeling the optical film from the encapsulation layer; and laminating a touch screen panel and a cover window on the encapsulation layer. When peeling the optical film from the encapsulation layer, an excellent antistatic function is obtained in the encapsulation layer, and therefore, the lamination structure may be formed without generating static electricity.

Hereinafter, the present application will be described in more detail with reference to examples that follow the present application and a comparative example that does not follow the present application, however, the scope of the present application is not limited to the examples provided below.

EXAMPLES

Preparation of Optical Film

Example 1

A film (H33P-both surfaces, Kolon) having a thickness of 75 mm in which both surfaces of a polyethylene terephthalate (PET) film are coated with a first antistatic layer and a second antistatic layer was prepared as a base layer. Subsequently, 100 parts by weight of a silicone resin (Wacker Chemie AG, PSA820), 1.5 parts by weight of a platinum-based catalyst (Wacker Chemie AG, PT5) and 3 parts by weight of a curing agent (Wacker Chemie AG, V-24) were mixed and diluted with toluene to prepare an adhesive composition. After coating the adhesive composition on the second antistatic layer of the base layer, the result was dried for 4 minutes and cured in a 150° C. oven to form a silicone-based adhesive layer having a thickness of 75 μm. A protective layer (12ASW, SKC) having a thickness of 50 μm in which a third antistatic layer and a fourth antistatic layer are formed on both surfaces of a polyethylene terephthalate (PET) film (XD510P, TAK Inc.) was laminated thereon so that the third antistatic layer touches the silicone-based adhesive layer, and an optical film was prepared.

Example 2

An optical film was prepared in the same manner as in Example 1 except that, instead of the adhesive composition of Example 1, an adhesive composition prepared by mixing 80 parts by weight of a silicone resin (Wacker Chemie AG, PSA820), 20 parts by weight of a silicone resin (Wacker Chemie AG, LSR7665), 1.5 parts by weight of a platinum-based catalyst (Wacker Chemie AG, PT5) and 3 parts by weight of a curing agent (Wacker Chemie AG, V-24), and diluting the result with toluene was used.

Example 3

An optical film was prepared in the same manner as in Example 1 except that, instead of the adhesive composition of Example 1, an adhesive composition prepared by mixing 60 parts by weight of a silicone resin (Wacker Chemie AG, PSA820), 40 parts by weight of a silicone resin (Wacker Chemie AG, LSR7665) and 1.5 parts by weight of a platinum-based catalyst (Wacker Chemie AG, PT5), and diluting the result with toluene was used.

Comparative Example 1

An optical film was prepared in the same manner as in Example 1 except that, instead of the base layer of Example 1, a film (H33P-one surface, Kolon) having a tickness of 75 mm in which one surface of a polyethylene terephthalate (PET) film is coated with a first antistatic layer was used as the base layer.

Properties of the examples and the comparative example were measured as follows, and the results are shown in Table 1 and Table 2.

Peel Strength Measurement

A specimen was prepared by cutting each of the optical films of the examples to have a width of 50 mm and a length of 150 mm. From the optical film, the protective layer was peeled at a peel angle of 180° and a peel rate of 1.8 m/min, the adhesive layer of the optical film was attached to glass using a 2 kg roller, and the result was stored for 24 hours at room temperature. Then, peel strength when peeling the optical film from the glass at a peel rate of 0.3 m/min and a peel angle of 180° was measured using a texture analyzer (manufactured by Stable Micro Systems of England).

Wetting Time Measurement

A specimen was prepared by cutting each of the optical films of the examples to have a width of 50 mm and a length of 150 mm. From the optical film, the protective layer was peeled at a peel angle of 180° and a peel rate of 1.8 m/min, the adhesive layer of the optical film was attached to glass, and time taken for the whole adhesive layer to be wetted on the glass was measured.

Peeling Static Voltage Measurement

Each of the optical films of the examples and the comparative example was cut to have a width of 250 mm and a length of 250 mm. After leaving the optical film unattended for 24 hours under a temperature of 23° C. and relative humidity of 50%, a peeling static voltage of the silicone-based adhesive layer when peeling the protective layer from the optical film at a peel rate of 1.8 m/min was measured and a peel angle of 180°. The peeling static voltage was measured by applying a voltage of 10 kV using a static honestmeter (static honestmeter H-0110, manufactured by Shishido Electrostatic, Ltd.).

TABLE 1

|  | Example 1 | Example 2 | Example 3 | Comparative Example 1 |
| --- | --- | --- | --- | --- |
| Peeling Static Voltage (kV) | 1.5 | 1.4 | 1.3 | 2.5 |

TABLE 2

|  | Example 1 | Example 2 | Example 3 |
| --- | --- | --- | --- |
| Peel Strength (gf/in) | 6.4 | 4.5 | 2.4 |
| Wetting Time (s) | 2 | 2 | 2 |

From Table 1, it was identified that the silicone-based adhesive layers of Examples 1 to 3 in which a second antistatic layer is present between the silicone-based adhesive layer and the base film had a low peeling static voltage compared to the silicone-based adhesive layer of Comparative Example 1 in which a second antistatic layer is not present between the silicone-based adhesive layer and the base film.

REFERENCE NUMERAL

11A: First Antistatic Layer
11B: Third Antistatic Layer
11C: Fourth Antistatic Layer
11D: Second Antistatic Layer
110: Base Layer
111: Base Film 121: Silicone-Based Adhesive Layer
130: Protective Layer
131: Protective Film
510: Organic Light Emitting Device
511: Back Plate Film
512: Plastic Substrate
513: Thin Film Transistor
514: Organic Light Emitting Diode
515: Encapsulation Layer

The invention claimed is:

1. An optical film comprising:
a base layer comprising a base film, a first antistatic layer and a second antistatic layer each provided on opposing surfaces of the base film;
a protective layer comprising a protective film, a third antistatic layer and a fourth antistatic layer each provided on opposing surfaces of the protective film; and
a silicone-based adhesive layer provided between the base layer and the protective layer so that the second antistatic layer and the third antistatic layer face each other,
wherein the silicone-based adhesive layer is in direct contact with the third antistatic layer.

2. The optical film of claim 1, wherein at least one of the first antistatic layer, the second antistatic layer, the third antistatic layer and the fourth antistatic layer comprises a conductive material.

3. The optical film of claim 1, wherein:
the first antistatic layer has a thickness of greater than or equal to 10 nm and less than or equal to 400 nm,
the second antistatic layer has a thickness of greater than or equal to 10 nm and less than or equal to 400 nm,
the third antistatic layer has a thickness of greater than or equal to 10 nm and less than or equal to 400 nm, and
the fourth antistatic layer has a thickness of greater than or equal to 10 nm and less than or equal to 400 nm.

4. The optical film of claim 1, wherein a peel strength of the silicone-based adhesive layer measured, when adhered to glass, at a peel angle of 180° and a peel rate of 0.3 m/min, is greater than or equal to 0.5 gf/in and less than or equal to 7 gf/in.

5. The optical film of claim 1, wherein a wetting time of the silicone-based adhesive layer, when applied to glass, is longer than or equal to 1 second and shorter than or equal to 4 seconds.

6. The optical film of claim 1, wherein a peeling static voltage of the silicone-based adhesive layer measured at an applying voltage of 10 kV is greater than or equal to 0 kV and less than or equal to 2 kV.

7. A method for preparing an optical film comprising:
forming a base layer comprising a base film, a first antistatic layer and a second antistatic layer each provided on opposing surfaces of the base film;
forming a protective layer comprising a protective film, a third antistatic layer and a fourth antistatic layer each provided on opposing surfaces of the protective film; and
bonding the base layer and the protective layer by a silicone-based adhesive layer,
wherein the second antistatic layer and the third antistatic layer face each other; and
the silicone-based adhesive layer is in direct contact with the third antistatic layer.

8. A method for manufacturing an organic light emitting electronic device comprising:
forming and optical film by:
forming a base layer comprising a base film, a first antistatic layer and a second antistatic layer each provided on opposing surfaces of the base film;
forming a protective layer comprising a protective film, a third antistatic layer and a fourth antistatic layer each provided on opposing surfaces of the protective film; and
bonding the base layer and the protective layer by a silicone-based adhesive layer,
wherein the second antistatic layer and the third antistatic layer face each other; and
the silicone-based adhesive layer is in direct contact with the third antistatic layer;
removing the protective layer from the optical film; and
attaching the silicone-based adhesive layer of the optical film on an encapsulation layer of the organic light emitting device.

9. The method for manufacturing an organic light emitting electronic device of claim 8, wherein the organic light emitting device comprises a back plate, a plastic substrate, a thin film transistor, an organic light emitting diode and an encapsulation layer in a consecutive order.

* * * * *